United States Patent
Lee

(10) Patent No.: US 10,445,194 B2
(45) Date of Patent: Oct. 15, 2019

(54) MEMORY SYSTEM STORING CHECKPOINT INFORMATION AND OPERATING METHOD THEREOF

(71) Applicant: SK hynix Inc., Gyeonggi-do (KR)

(72) Inventor: Jong-Min Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 179 days.

(21) Appl. No.: 15/602,732

(22) Filed: May 23, 2017

(65) Prior Publication Data
US 2018/0081551 A1 Mar. 22, 2018

(30) Foreign Application Priority Data
Sep. 19, 2016 (KR) .................. 10-2016-0119324

(51) Int. Cl.
| *G06F 11/00* | (2006.01) |
| *G06F 11/14* | (2006.01) |
| *G06F 3/06* | (2006.01) |
| *G06F 11/10* | (2006.01) |
| *G11C 29/52* | (2006.01) |

(52) U.S. Cl.
CPC ........ *G06F 11/1469* (2013.01); *G06F 3/0604* (2013.01); *G06F 3/064* (2013.01); *G06F 3/065* (2013.01); *G06F 3/0619* (2013.01); *G06F 3/0659* (2013.01); *G06F 3/0685* (2013.01); *G06F 11/1068* (2013.01); *G06F 11/1072* (2013.01); *G06F 11/1451* (2013.01); *G11C 29/52* (2013.01); *G06F 2201/805* (2013.01); *G06F 2201/82* (2013.01)

(58) Field of Classification Search
CPC ........ G06F 3/065; G06F 3/0619; G06F 3/064; G06F 11/1446; G06F 11/1451; G06F 11/1469
See application file for complete search history.

(56) References Cited

U.S. PATENT DOCUMENTS

| 8,370,567 | B1 * | 2/2013 | Bonwick | G06F 3/0688 |
| | | | | 711/103 |
| 9,170,938 | B1 * | 10/2015 | Walsh | G06F 12/0246 |
| 10,073,651 | B2 * | 9/2018 | Lee | G06F 3/0604 |
| 2009/0089610 | A1 * | 4/2009 | Rogers | G06F 11/1469 |
| | | | | 714/5.1 |
| 2014/0208003 | A1 * | 7/2014 | Cohen | G11C 16/08 |
| | | | | 711/103 |
| 2015/0186261 | A1 * | 7/2015 | Lin | G06F 11/1435 |
| | | | | 711/103 |
| 2018/0004439 | A1 * | 1/2018 | Byun | G06F 3/0619 |
| 2018/0356998 | A1 * | 12/2018 | Wu | G06F 3/0619 |

FOREIGN PATENT DOCUMENTS

| KR | 1020150045747 | 4/2015 |
| KR | 1020150053092 | 5/2015 |
| KR | 1020150130638 | 11/2015 |
| KR | 1020150139112 | 12/2015 |
| KR | 1020160027805 | 3/2016 |

* cited by examiner

*Primary Examiner* — Michael Maskulinski
(74) *Attorney, Agent, or Firm* — IP & T Group LLP

(57) ABSTRACT

A memory system may include: a memory device including a plurality of memory blocks each memory block having a plurality of pages; and a controller suitable for performing a program operation of storing data segments and meta segments in the pages, and recording a checkpoint information for the program operation in the pages.

18 Claims, 11 Drawing Sheets

MEMORY SYSTEM STORING CHECKPOINT INFORMATION AND OPERATING METHOD THEREOF

CROSS-REFERENCE TO RELATED APPLICATION

This application claims priority under 35 U.S.C. § 119 to Korean Patent Application No. 10-2016-0119324 filed on Sep. 19, 2016 in the Korean Intellectual Property Office, the disclosure of which is incorporated herein by reference in its entirety.

TECHNICAL FIELD

Exemplary embodiments relate to a memory system, and more particularly, to a memory system which processes data to and from a memory device, and an operating method thereof.

DISCUSSION OF THE RELATED ART

The computer environment paradigm has changed to ubiquitous computing systems that can be used anytime and anywhere. Due to this, use of portable electronic devices such as mobile phones, digital cameras, and notebook computers has rapidly increased. These portable electronic devices generally use a memory system having one or more memory devices for storing data. A memory system may be used as a main memory device or an auxiliary memory device of a portable electronic device.

Memory systems provide excellent stability, durability, high information access speed, and low power consumption since they have no moving parts. Examples of memory systems having such advantages include universal serial bus (USB) memory devices, memory cards having various interfaces and solid state drives (SSD).

SUMMARY

Various embodiments are directed to a memory system capable of quickly and stably processing data thereto and therefrom, and an operating method thereof.

In an embodiment, a memory system may include: a memory device including a plurality of memory blocks each memory block having a plurality of pages; and a controller suitable for performing a program operation of storing data segments and meta segments in the pages, and recording a checkpoint information for the program operation in the pages.

The checkpoint information may indicate starts and/or ends of the program operation.

The controller may record the checkpoint information in pages of first memory blocks for a first program operation of first data segments and first meta segments into first pages of the first memory blocks at a first time during a power-on state.

The controller may further record the checkpoint information in pages of the first memory blocks for a second program operation of second data segments and second meta segments in second pages of the first memory blocks at a second time after the first time during the power-on state.

In the case where a power-off occurs in the memory system while the second program operation is performed and then the power is restored at a third time after the second time, the controller may further check the checkpoint information.

The controller may further copy and stores data of the first memory blocks in pages of the second memory blocks according to a result of the checking of the checkpoint information.

The controller may check the ends of the first program operation through the checkpoint information, and then may copy and may store the first data segments and the first meta segments into the pages of the second memory blocks.

The controller may check the starts of the first program operation and the second program operation through the checkpoint information, and then may copy and stores the first data segments, the first meta segments, the second data segments and the second meta segments into the pages of the second memory blocks.

The controller may further perform a recovery operation for the second program operation, in the second memory blocks.

The checkpoint information may be recorded in at least one of header regions and tail regions of the pages.

In an embodiment, a method for operating a memory system including a plurality of memory blocks each having a plurality of pages, the method may include: performing a program operation of storing data segments and meta segments in the pages; and recording a checkpoint information for the program operation in the pages.

The checkpoint information may indicate starts or ends of the program operation.

The performing of the program operation may include recording the checkpoint information in pages of a first memory blocks for a first program operation of first data segments and first meta segments into first pages of the first memory blocks at a first time during a power-on state.

The performing of the program operation may further include recording the checkpoint information in pages of the first memory blocks for a second program operation of second data segments and second meta segments in second pages of the first memory blocks at second time after the first time during the power-on state.

The method may further include checking the checkpoint information in the case where a power-off occurs in the memory system while the second program operation is performed and then the power is restored at a third time after the second time.

The method may further include copying and storing data of the first memory blocks in pages of the second memory blocks according to a result of the checking of the checkpoint information.

The checking of the checkpoint information may include checking the ends of the first program operation through the checkpoint information, and the copying and storing of the data may include copying and storing the first data segments and the first meta segments into the pages of the second memory blocks.

The checking of the checkpoint information may include checking the starts of the first program operation and the second program operation through the checkpoint information, and the copying and storing of the data may include copying and storing the first data segments, the first meta segments, the second data segments and the second meta segments into the pages of the second memory blocks.

The method may further include performing a recovery operation for the second program operation, in the second memory blocks.

The checkpoint information may be recorded in at least one of header regions and tail regions of the pages.

BRIEF DESCRIPTION OF THE DRAWINGS

These and other features and advantages of the present invention will become apparent to those skilled in the art to which the present invention pertains from the following detailed description in reference to the accompanying drawings, wherein:

FIG. 1 is a block diagram illustrating a data processing system including a memory system in accordance with an embodiment of the present invention.

DETAILED DESCRIPTION

Figure 1:
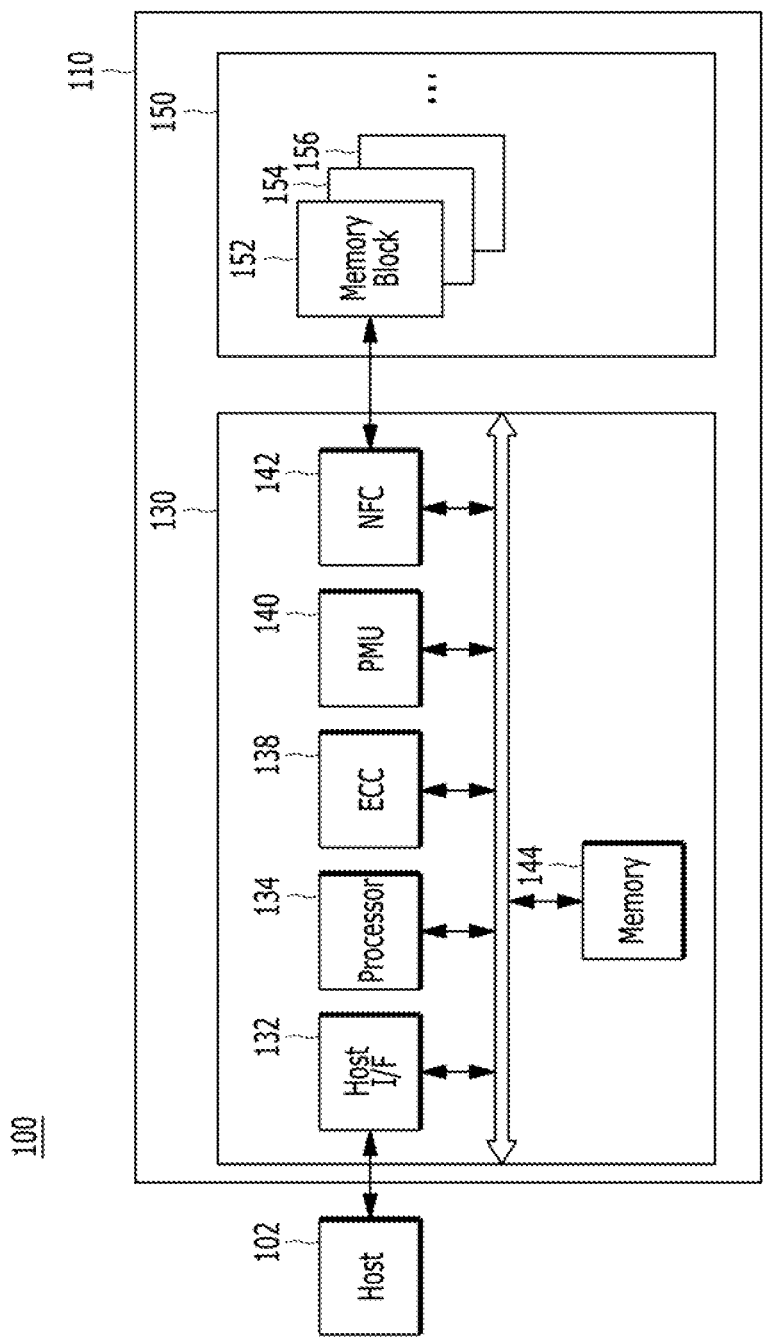

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second" "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

FIG. 1 is a block diagram illustrating a data processing system 100 including a memory system 100 in accordance with an embodiment of the present invention.

Referring to FIG. 1, the data processing system 100 may include a host 102 and the memory system 110.

The host 102 may include portable electronic devices such as a mobile phone, MP3 player and laptop computer or non-portable electronic devices such as a desktop computer, game machine, TV and projector.

The host 102 may include at least one OS (operating system), and the OS may manage and control overall functions and operations of the host 102, and provide an operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile. At this time, the host 102 may include a plurality of OSs, and execute an OS to perform an operation corresponding to a user's request on the memory system 110.

The memory system 110 may operate to store data for the host 102 in response to a request of the host 102. Non-limited examples of the memory system 110 may include solid state drive (SSD), multi-media card (MMC), secure digital (SD) card, universal storage bus (USB) device, universal flash storage (UFS) device, compact flash (CF) card, smart media card (SMC), personal computer memory card international association (PCMCIA) card and memory stick. The MMC may include an embedded MMC (eMMC), reduced size MMC (RS-MMC) and micro-MMC, and the SD card may include a mini-SD card and micro-SD card.

The memory system 110 may be embodied by various types of storage devices. Non-limited examples of storage devices included in the memory system 110 may include volatile memory devices such as DRAM dynamic random access memory (DRAM) and static RAM (SRAM) and nonvolatile memory devices such as read only memory (ROM), mask ROM (MROM), programmable ROM (PROM), erasable programmable ROM (EPROM), electrically erasable programmable ROM (EEPROM), ferroelectric RAM (FRAM), phase-change RAM (PRAM), magneto-resistive RAM (MRAM), resistive RAM (RRAM) and flash memory. The flash memory may have a 3-dimensional (3D) stack structure.

The memory system 110 may include a memory device 150 and a controller 130. The memory device 150 may store data for the host 120, and the controller 130 may control data storage into the memory device 150.

The controller 130 and the memory device 150 may be integrated into a single semiconductor device, which may be included in the various types of memory systems as exemplified above. For example, the controller 130 and the memory device 150 may be integrated as one semiconductor device to constitute an SSD. When the memory system 110 is used as an SSD, the operating speed of the host 102 connected to the memory system 110 can be improved. In addition, the controller 130 and the memory device 150 may be integrated as one semiconductor device to constitute a memory card. For example, the controller 130 and the memory device 150 may constitute a memory card such as a PCMCIA (personal computer memory card international association) card, CF card, SMC (smart media card), memory stick, MMC including RS-MMC and micro-MMC, SD card including mini-SD, micro-SD and SDHC, or UFS device.

Non-limited application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be nonvolatile memory device and may retain data stored therein even though power is not supplied. The memory device 150 may store data provided from the host 102 through a write operation, and provide data stored therein to the host 102 through a read operation. The memory device 150 may include a plurality of memory dies (not shown) each memory die including a plurality of planes (not shown), each plane including a plurality of memory blocks 152 to 156, each of the memory blocks 152 to 156 may include a plurality of pages, and each of the pages may include a plurality of memory cells coupled to a word line. In an embodiment, the memory device 150 may be a flash having a 3-dimensional (3D) stack structure.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) unit 132, a processor 134, an error correction code (ECC) unit 138, a Power Management Unit (PMU) 140, a NAND flash controller (NFC) 142 and a memory 144 all operatively coupled via an internal bus.

The host interface unit 132 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC unit 138 may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success/fail signal. When the number of error bits is more than a threshold value of correctable error bits, the ECC unit 138 may not correct the error bits, and may output an error correction fail signal.

The ECC unit 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC unit 138 is not limited thereto. The ECC unit 138 may include all circuits, modules, systems or devices for error correction.

The PMU 140 may provide and manage power of the controller 130.

The NFC 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the NFC 142 may generate a control signal for the memory device 150 and process data to be provided to the memory device 150 under the control of the processor 134. The NFC 142 may work as an interface (e.g., a NAND flash interface) for processing a command and data between the controller 130 and the memory device 150. Specifically, the NFC 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM), The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL).

The processor 134 of the controller 130 may include a management unit (not illustrated) for performing a bad management operation of the memory device 150. The management unit may perform a bad block management operation of checking a bad block, in which a program fail occurs due to the characteristic of a NAND flash memory during a program operation, among the plurality of memory blocks 152 to 156 included in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation needs to be performed with more re lability.

Figure 2:
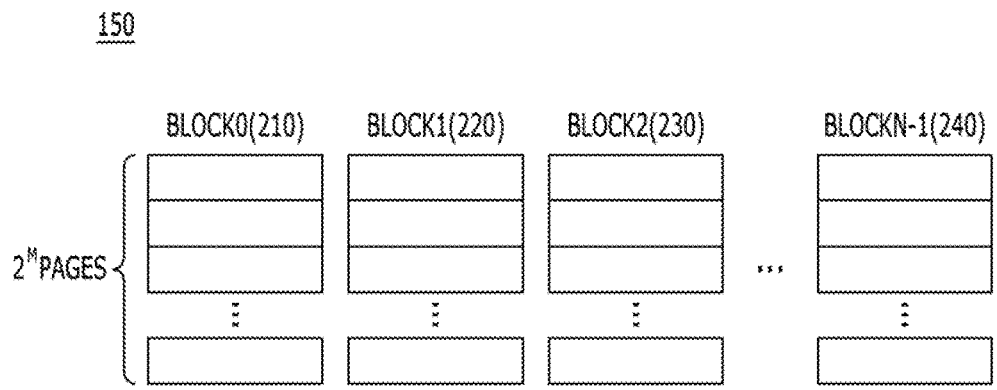
FIG. 2 is a schematic diagram illustrating an exemplary configuration of a memory device employed in the memory system of FIG. 1.

FIG. 2 is a schematic diagram illustrating the memory device 150.

Referring to FIG. 2, the memory device 150 may include a plurality of memory blocks 0 to N−1 and each of the blocks 0 to N−1 may include a plurality of pages, for example, $2^M$ pages, the number of which may vary according to circuit design. Memory cells included in the respective memory blocks 0 to N−1 may be one or more of a single level cell (SLC) storing 1-bit data, and a multi-level cell (MLC) storing 2 or more bit data. An MLC storing 3-bit data is also referred to as a triple level cell (TLC), and an MLC storing 4-bot data is also referred to as a quadruple level cell (QLC).

Figure 3:
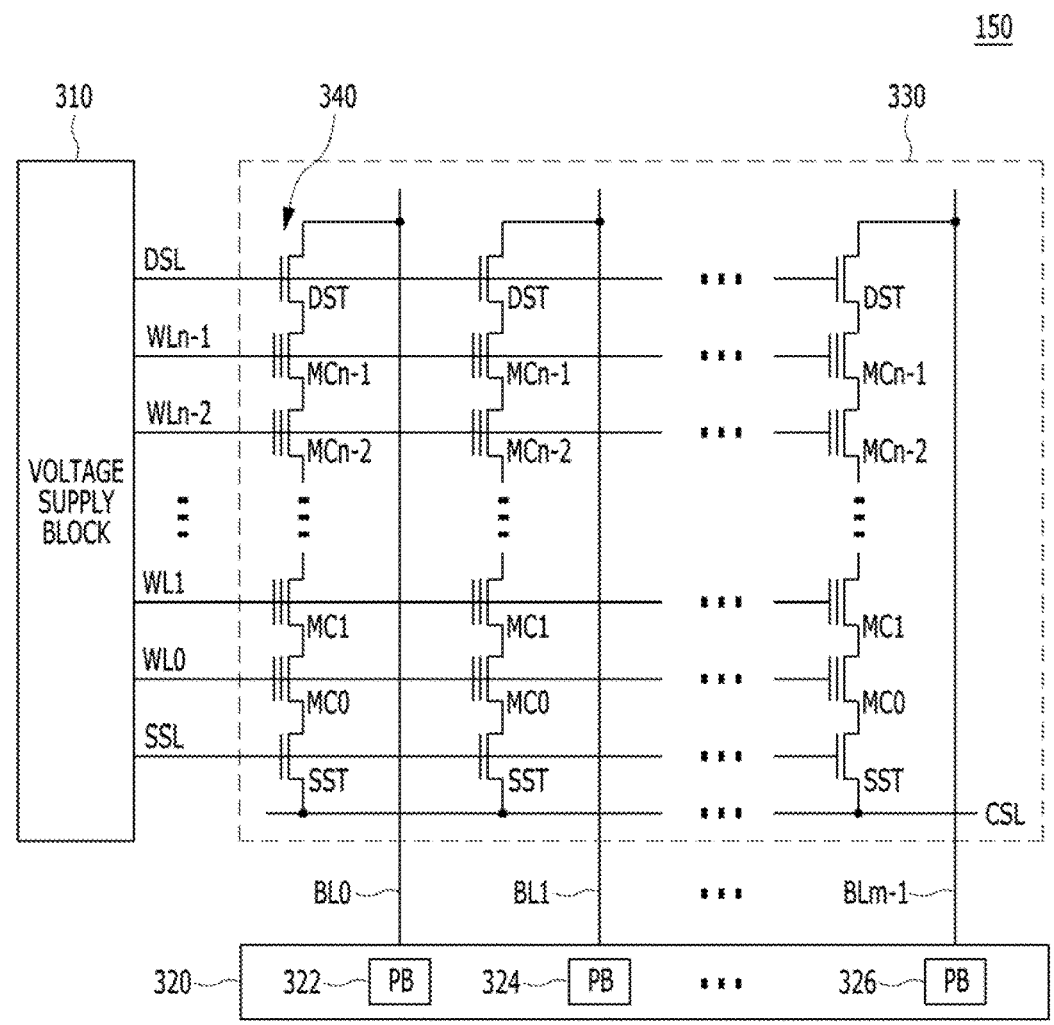
FIG. 3 is a circuit diagram illustrating an exemplary configuration of a memory cell array of a memory block employed in the memory device of FIG. 2.

FIG. 3 is a circuit diagram illustrating an exemplary configuration of a memory cell array of a memory block in the memory device 150.

Referring to FIG. 3, a memory block 330 which may correspond to any of the plurality of memory blocks 152 to 156 included in the memory device 150 of the memory system 110 may include a plurality of cell strings 340 coupled to a plurality of corresponding bit lines BL0 to BLm−1. The cell string 340 of each column may include one or more drain select transistors DST and one or more source select transistors SST. Between the select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the invention is not limited in this way. It is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply unit 310 which provides word line voltages including a program voltage, a read voltage and a pass voltage to supply to the word lines according to an operation mode. The voltage generation operation of the voltage supply unit 310 may be controlled by a control circuit (not illustrated). Under the control of the control circuit the voltage supply unit 310 may select one of the memory blocks (or sectors) of the memory cell array, select one of the word lines of the selected memory block, and provide the word line voltages to the selected word line and the unselected word lines.

The memory device 150 may include a read/write circuit 320 which is controlled by the control circuit. During a verification/normal read operation the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
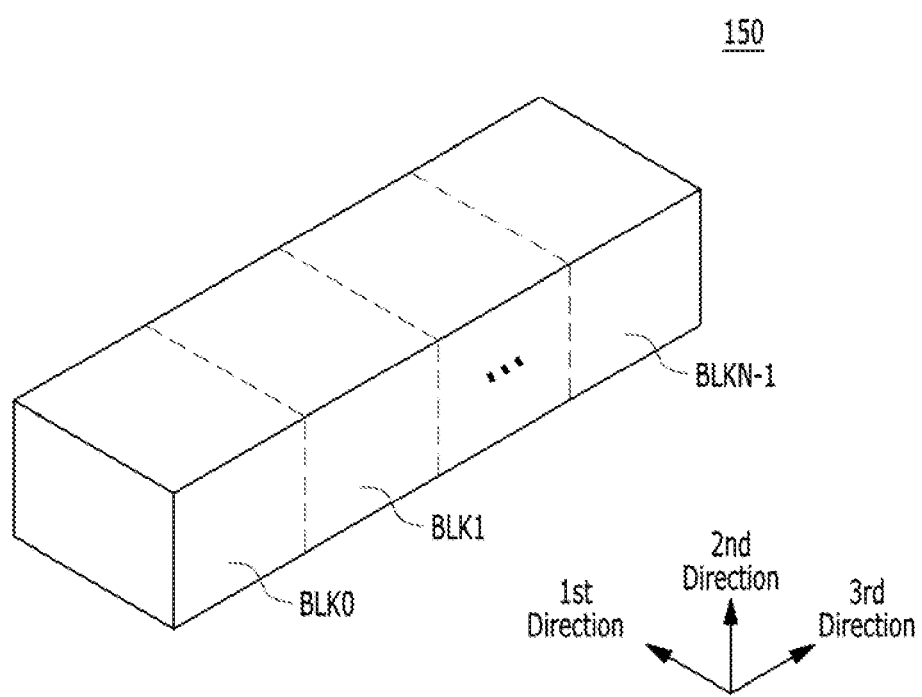
FIG. 4 is a schematic diagram illustrating an exemplary three-dimensional structure of the memory device of FIG. 2.

FIG. 4 is a schematic diagram illustrating an exemplary 3D structure of the memory device 150.

The memory device 150 may be embodied by a 2D or 3D memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1 each of the memory blocks having a 3D structure (or vertical structure).

Figure 5:
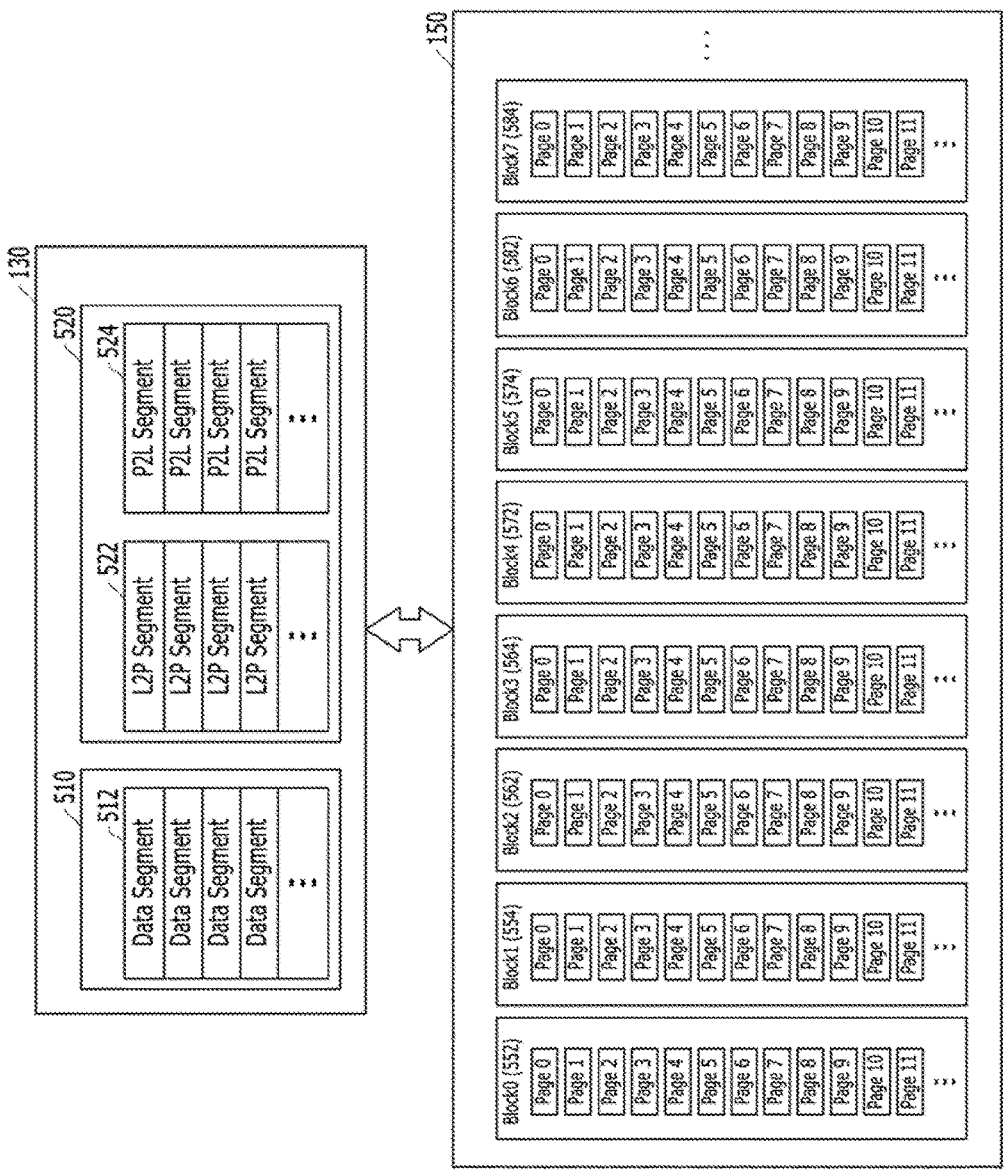
FIGS. 5 to 7 are schematic diagrams illustrating a data processing operation to a memory device in a memory system in accordance with an embodiment of the present invention.
Figure 6:
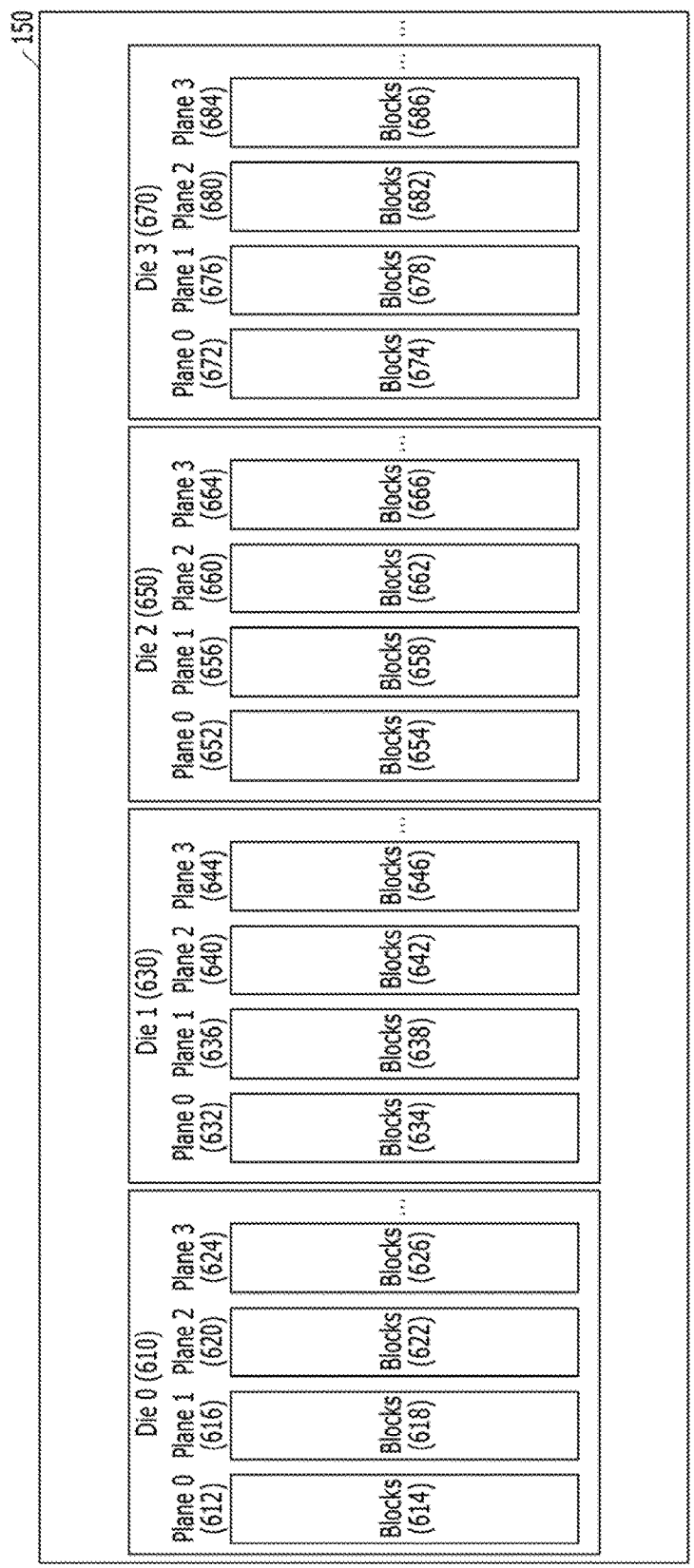
Figure 7:
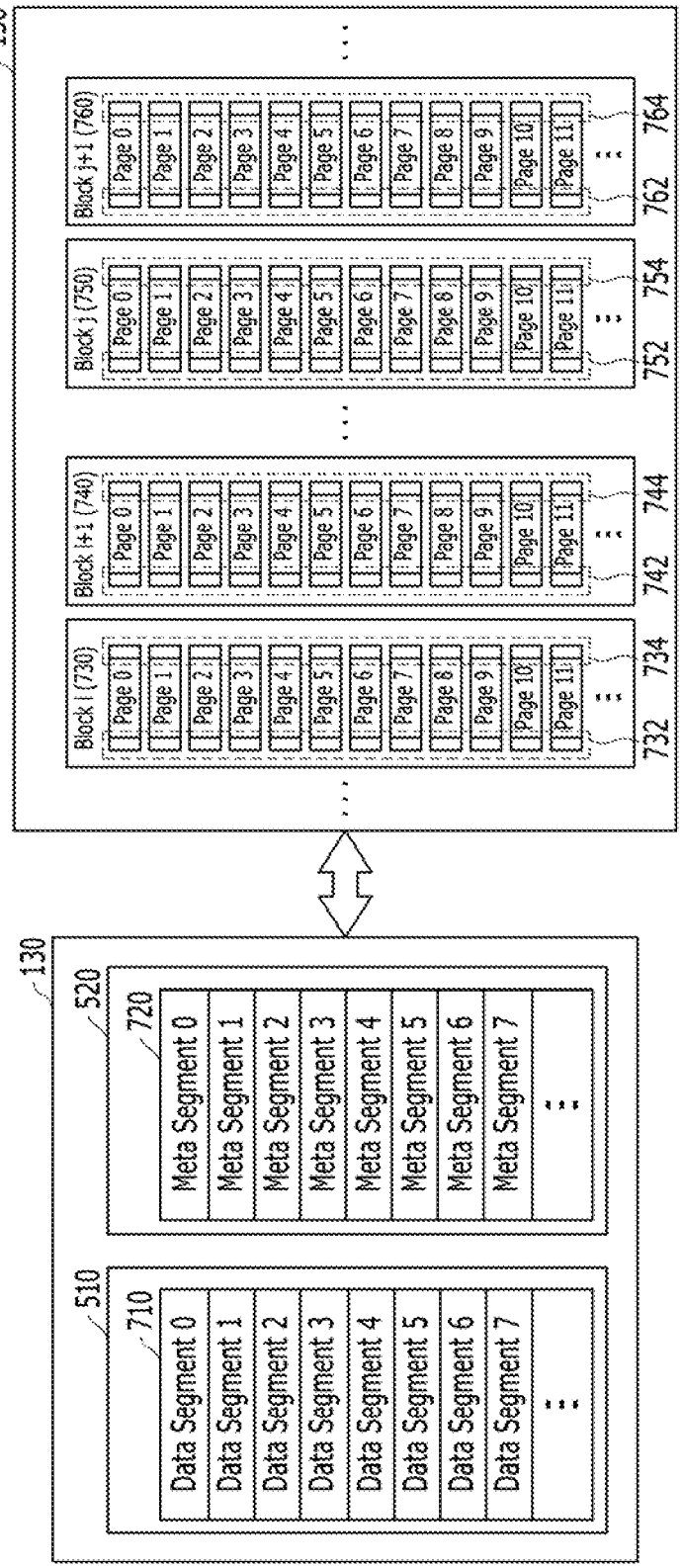

FIGS. 5 to 7 are schematic diagrams illustrating a data processing operation to a memory device in a memory system in accordance with an embodiment of the present invention.

Hereinbelow in the embodiment of the present disclosure, descriptions will be made, as an example, for data processing in the case where, after storing write data corresponding to the write command, in the buffer/cache included in the memory 144 of the controller 130, the data stored in the buffer/cache are written and stored, that is, programmed, in a plurality of memory blocks included in the memory device 150, and map data are updated in correspondence to the program operation with respect to the memory device 150.

According to an embodiment of the present disclosure, when a read command is received from the host 102 for data stored in the memory device 150, data corresponding to the read command are read from the memory device 150 by checking map data of the data corresponding to the read command, and, after storing the read data in the buffer/cache included in the memory 144 of the controller 130, the data stored in the buffer/cache are provided to the host 102.

Further, while, in the present embodiment, it will be described below as an example for the sake of convenience that the controller 130 performs a data processing operation in the memory system 110, it is to be noted that, as described above, the processor 134 included in the controller 130 may perform a data processing operation through, for example, an FTL (flash translation layer). For example, in the embodiment of the present disclosure, after storing user data and metadata corresponding to a write command received from the host 102 in the buffer included in the memory 144 of the controller 130, the controller 130 may write and store the data stored in the buffer, in one or more arbitrary memory blocks among the plurality of memory blocks included in the memory device 150, that is, the controller may perform a program operation.

The metadata may include logical-to-physical (L2P) map data including L2P information and physical-to-logical (P2L) map data including P2L information, for the data stored in the memory blocks in correspondence to the program operation. Also, the metadata may include an information on the command data corresponding to the command, an information on the command operation corresponding to the command, an information on the memory blocks of the memory device 150 for which the command operation is to be performed, and an information on map data corresponding to the command operation.

According to an embodiment, when data segments of user data are stored in one or more memory blocks of the memory device 150, the controller 130 may generate and update the meta segments of the corresponding metadata, that is, the L2P segments of the L2P map data and the P2L segments of the P2L map data as the map segments of the map data, and may store the map segments in one or more memory blocks of the memory device. In an embodiment, the one or more memory blocks where the map segments are stored may be the same one or more memory blocks where the data segments of the user data are stored. Then, the controller 130 may update the map segments stored in the one or more memory blocks, by loading them in the memory 144 of the controller 130.

According to an embodiment, when receiving a read command from the host 102, the controller 130 may read data from the memory device 150, store the read data in the buffer/cache included in the memory 144 of the controller 130, and then, provide the data of the buffer/cache to the host 102.

In an embodiment of the present disclosure, descriptions will be made by exemplifying data processing in the case where, after the memory system 110 is changed to a power-off state as a sudden power-off occurs while performing a program operation in a power-on state, the power of the memory system 110 is restored.

In an embodiment of the present disclosure, a booting operation and a recovery operation may be performed in the case where the power is restored after the memory system 110 is changed to the power-off state as a sudden power-off occurs in the memory system 110 while the memory system 110 performs a program operation to an arbitrary page of an arbitrary memory block among the plurality of memory blocks.

Referring to FIG. 5, the controller 130 generates and updates information indicating that the user data are stored in the pages included in the memory blocks 552 to 584, for example, L2P map data and P2L map data, that is, generates and updates the logical segments of the L2P map data, that is, L2P segments, and the physical segments of the P2L map data, that is, P2L segments, and then, stores the L2P segments and the P2L segments in the memory blocks 552 to 584.

For example, the controller 130, when performing a program operation, may first cache and buffer data segments 512 of the user data in the first buffer 510 as a data buffer/cache. Then, the controller 130 may write and store the data segments 512 of the first buffer 510 in the pages included in the memory blocks 552 to 584. According to the storage of the user data into the memory blocks 552 to 584, the controller 130 may then generate and update the L2P map data and the P2L map data, and store the L2P map data and the P2L map data in a second buffer 520 included in the memory 144 of the controller 130. Namely, the controller 130 may store L2P segments 522 of the L2P map data for the user data and P2L segments 524 of the P2L map data for the user data, in the second buffer 520 as a map buffer/cache. In the second buffer 520 in the memory 144 of the controller 130, there may be stored, as described above, the L2P segments 522 of the L2P map data and the P2L segments 524 of the P2L map data, or there may be stored a map list for the L2P segments 522 of the L2P map data and a map list for the P2L segments 524 of the P2L map data. Then, the controller 130 writes and stores the L2P segments 522 of the L2P map data and the P2L segments 524 of the P2L map data which are stored in the second buffer 520, in the pages included in the memory blocks 552 to 584.

Also, the controller 130 loads the map segments of user data corresponding to a read command, for example, L2P segments 522 of L2P map data and P2L segments 524 of P2L map data, into the second buffer 520. After that, the controller 130 may read the user data stored in the pages included in corresponding memory blocks among the memory blocks 552 to 584, store data segments 512 of the read user data in the first buffer 510, and provides the data segments 512 to the host 102.

Referring to FIG. 6, the memory device 150 may include a plurality of memory dies, for example, a memory die 0 610, a memory die 1 630, a memory die 2 650 and a memory die 3 670. Each of the memory dies 610 to 670 may include a plurality of planes. For example, the memory die 0 610 may include a plane 0 612, a plane 1 616, a plane 2 620 and a plane 3 624. The memory die 1 630 may include a plane 0 632, a plane 1 636, a plane 2 640 and a plane 3 644. The memory die 2 650 include a plane 0 652, a plane 1 656, a plane 2 660 and a plane 3 664, The memory die 3 670 may include a plane 0 672, a plane 1 676, a plane 2 680 and a plane 3 684. The respective planes 612 to 684 in the memory dies 610 to 670 include a plurality of memory blocks 614 to 686.

Referring to FIG. 7, the controller 130 may write and store user data corresponding to a write command in the memory blocks, for example, a memory block i 730 and a memory block i+1 740. According to the program operation to the memory block i 730 and the memory block i+1 740, the controller 130 may then generate and update metadata for the user data, and may write and store the metadata in the same memory blocks, for example, the memory block i 730 and the memory block i+1 740, respectively. In other words, according to an embodiment, the controller 130 may store in the i-730 memory block the metadata for the user data which are stored in the memory block I 730. Also, the controller 130 may store in the i+1 740 memory block the metadata for the user data stored in the memory block i+1 740. However, the invention is not limited in this way and it is noted that the controller 130 may generally store the user data and the metadata in the same or different memory blocks.

The controller 130 may generate and update L2P segments of the L2P map data and P2L segments of the P2L map data indicating that the user data are stored in the pages included in the memory block i 730 and the memory block i+1 740, and then, writes and stores the L2P segments and the P2L segments in the pages included in the memory block i 730 and the memory block i+1 740.

In other words, the controller 130 stores data segments 710 of the user data in the first buffer 510 as a data buffer/cache. Then, the controller 130 writes and stores the data segments 710 of the first buffer 510 in the pages included in the memory block i 730 and the memory block i+1 740.

Further, the controller 130 may generate the L2P segments and P2L segments (i.e., the map segments included in meta segments 720) of the L2P map data and the P2L map data (i.e., the metadata) for the data segments 710 of the user data, and stores the meta segments 720 including the map segments in the second buffer 520 as a map buffer/cache. In the second buffer 520 in the memory 144 of the controller 130, the meta segments 720 which include the L2P segments of the L2P map data and the P2L segments of the P2L map data or a map list for the L2P segments of the L2P map data and a map list for the P2L segments of the P2L map data. The controller 130 may then write and store the meta segments 720 of the second buffer 520 in the pages included in the memory block i 730 and the memory block i+1 740.

In the case of storing the data segments 710 of the first buffer 510 or the meta segments 720 of the second buffer 520 in the pages included in the memory block i 730 and the memory block i+1 740, that is, in the case of performing the program operation of the data segments 710 or the meta segments 720 into the memory block i 730 and the memory block i+1 740, the controller 130 may record and store a checkpoint information in header regions 732 and 742 or tail regions 734 and 744 of the pages included in the memory block i 730 and the memory block i+1 740.

The checkpoint information may indicate the starts and/or the ends of the program operation of the data segments 710 and or the meta segments 720 into the corresponding pages included in the memory block 730 and the memory block i+1 740.

For example, in the case of programming a data segment 0, a data segment 1, a data segment 2 and a data segment 3 into pages 0 and pages 1 included in the memory block i 730 and the memory block i+1 740, the controller 130 may generate the checkpoint information indicating the starts and/or the ends of the program operation of the data segment 0, the data segment 1, the data segment 2 and the data segment 3 into the pages 0 and the pages 1 included in the memory block i 730 and the memory block i+1 740. The controller 130 may then store the checkpoint information in the header regions 732 and 742 and/or the tail regions 734 and 744 of the pages 0 and the pages 1 included in the memory block i 730 and the memory block i+1 740.

Also, in the case of programming a meta segment 0, a meta segment 1, a meta segment 2 and a meta segment 3 into pages 2 and pages 3 included in the memory block i 730 and the memory block i+1 740, the controller 130 generates the checkpoint information indicating the starts and/or the ends of the program operation of the meta segment 0, the meta segment 1, the meta segment 2 and the meta segment 3 into the pages 2 and the pages 3 included in the memory block i 730 and the memory block i+1 740. The controller 130 may store the checkpoint information in the header regions 732 and 742 or the tail regions 734 and 744 of the pages 2 and the pages 3 included in the memory block i 730 and the memory block i+1 740.

Further, in the case of programming a data segment 4, a data segment 5, a data segment 6 and a data segment 7 into pages 4 and pages 5 included in the memory block i 730 and the memory block i+1 740, the controller 130 generates the checkpoint information indicating the starts and/or the ends of the program operation to the data segment 4, the data segment 5, the data segment 6 and the data segment 7 into the pages 4 and the pages 5 included in the memory block i 730 and the memory block i+1 740. The controller 130 may store the checkpoint information in the header regions 732 and 742 or the tail regions 734 and 744 of the pages 4 and the pages 5 included in the memory block i 730 and the memory block i+1 740.

For example, in the case where a sudden power-off occurs while performing the program operation of the data segment 4, the data segment 5 the data segment 6 and the data segment 7 into the pages 4 and the pages 5 included in the memory block i 730 and the memory block i+1 740, the controller 130 performs a booting operation and a recovery operation to the memory system 110 when the power to the memory system 110 is restored.

During the booting operation, the controller 130 may check the checkpoint information recorded in the header regions 732 and 742 and/or the tail regions 734 and 744 of the pages included in the memory block i 730 and the memory block i+1 740.

Through the checkpoint information, the controller 130 may check that a power-off has occurred in the memory system 110 while performing the program operation to the pages 4 and the pages 5 included in the memory block i 730 and the memory block i+1 740.

Depending on the check that a power-off has occurred in the memory system 110 while performing the program operation to the pages 4 and the pages 5 included in the memory block i 730 and the memory block i+1 740, the controller 130 performs a garbage collection operation to the memory device 150.

For example, during the garbage collection operation, the controller 130 may select as source memory blocks the memory block i 730 and the memory block i+1 740, to which the program operation is performed at a time of the power-off, and may select as target memory blocks empty memory blocks, for example, a memory block j 750 and a memory block j+1 760 among the memory blocks in the memory device 150. The controller 130 may then copy and store the data of the source memory blocks in the pages included in the target memory blocks.

During the garbage collection operation, the controller 130 may check whether the program operation to the pages included in the source blocks (i.e., the memory block i 730 and the memory block i+1 740) is a success or a fail at the time of the power-off through the checkpoint information recorded in the header regions 732, 742 and/or the tail regions 734, 744 stored in the respective pages included in the source blocks. The controller 130 may then copy and store data of program-successful pages in the source blocks (i.e., the memory block i 730 and the memory block i+1 740) into the target blocks (i.e., the memory block j 750 and the memory block j+1 760).

The controller 130 may check through the checkpoint information stored in the header regions 732 and 742 or the tail regions 734 and 744 whether a program operation to pages of a memory block is a success or a fail, or not completed at the time of the power-off.

For example, the controller 130 checks, as valid pages, the pages 0, the pages 1, the pages 2 and the pages 3 of the memory block i 730 and the memory block i+1 740 in which the ends of the program operation are recorded in the checkpoint information recorded in the header regions 732, 742 and/or the tail regions 734, 744, and stores the data segment 0, the data segment 1, the data segment 2, the data segment 3, the meta segment 0, the meta segment 1, the meta segment 2 and the meta segment 3, as valid data, stored in the pages 0, the pages 1, the pages 2 and the pages 3 of the memory block i 730 and the memory block i+1 740, in the pages included in the memory block j 750 and the memory block j+1 760.

The controller 130 may check, as valid pages, pages in which the starts of the program operation are recorded in the checkpoint information recorded in the header regions 732 and 742 or the spare regions 734 and 744 of the pages included in the memory block i 730 and the memory block i+1 740, and then, store the valid data stored in the valid pages, in the pages included in the memory block j 750 and the memory block j+1 760. For example, the controller 130 may check, as valid pages, the pages 0, the pages 1, the pages 2, the pages 3, the pages 4 and the pages 5 of the memory block i 730 and the memory block i+1 740 in which the starts of the program operation are recorded in the checkpoint information recorded in the header regions 732, 742 and/or the spare regions 734, 744, and store the data segment 0, the data segment 1, the data segment 2, the data segment 3, the meta segment 0, the meta segment 1, the meta segment 2, the meta segment 3, the data segment 4, the data segment 5, the data segment 6 and the data segment 7, as valid data stored in the pages 0, the pages 1, the pages 2, the pages the pages 4 and the pages 5 of the memory block i 730 and the memory block i+1 740, in the pages included in the memory block j 750 and the memory block j+1 760.

After the garbage collection operation during the booting operation, the controller 130 performs the recovery operation according to the power-off occurred in the memory system 110. The recovery operation may be performed such that data segments or meta segments, which are subsequent to data segments or meta segments copied to the target memory blocks but are not programmed into the source memory block due to the sudden power-off, are programmed into the target memory blocks. That is to say, the controller 130 performs a program operation of data segments 710 and the meta segments 720, which are subsequent to data segments or meta segments copied to the target memory blocks but are not programmed into the source memory block due to the sudden power-off, into the target memory block. The controller 130 performs the recovery operation to the target memory block, for example, the memory block j 750 and the memory block j+1 760. For example, when assuming the data segments 4 to 7 are subsequent to data segments 1 to 3 copied to the target memory blocks but are not programmed into the source memory block due to the sudden power-off, the controller 130 performs a program operation to the data segment 4, the data segment 5, the data segment 6 and the data segment 7 into the target memory block, for example, the memory block j 750 and the memory block j+1 760.

The controller 130 stores the data segment 4 the data segment 5, the data segment 6 and the data segment 7 from pages subsequent to pages in which data are copied to the target memory blocks. Therefore, the controller 130 performs the recovery operation without performing program of dummy data in the target memory blocks.

In other words, in the embodiment of the present disclosure, as described above, in the case where, after a power-off occurs while performing, in the memory system 110, a command operation, for example, a program operation corresponding to a write command, a booting operation and a recovery operation are performed as the memory system 110 is changed again to a power-on state, as described above, when the memory system 110 is changed again to the power-on state, a garbage collection operation is preferentially performed for the memory device 150, and then, the booting operation and the recovery operation are performed in correspondence to the power-off of the memory system 110. As a consequence, a dummy data program operation in the memory device 150 due to the power-off of the memory system 110 may be minimized, and the utilization efficiency of memory blocks in the memory device 150 may be improved.

Figure 8:
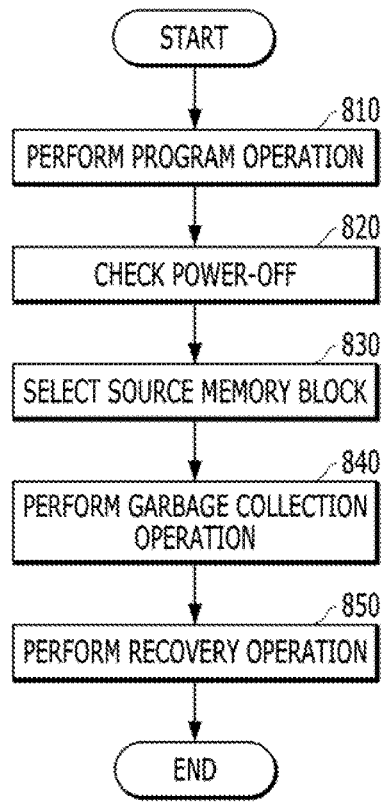
FIG. 8 is a flow chart illustrating an operation of a memory system in accordance with an embodiment of the present invention.

FIG. 8 is a flow chart illustrating an operation of the memory system 110 in accordance with an embodiment.

Referring to FIG. 8, at step 810, the memory system 110 performs a program operation corresponding to a write command.

Accordingly, first user data corresponding to the command are stored in the memory 144 of the controller 130 and then the data segments of the user data which are stored in the memory 144 are stored in one or more pages included in one or more memory blocks of the memory device 150. According to the storage of the data segments in the one or more pages of the one or more memory blocks of the memory device 150, the meta segments of metadata for the data segments are stored in the memory 144, and are then written and stored in the pages included in the memory blocks of the memory device 150. In the header regions and/or the tail regions of the pages included in the memory blocks, there is recorded a checkpoint information which indicates the starts or the ends of the program operation for the data segments or the meta segments.

At step 820, in the case where a sudden power-off occurs in the memory system 110 while the memory system 110 performs the program operation, the sudden power-off of the memory system 110 is checked, that is, it is checked that the memory system 110 is changed to a power-off state.

At step 830, when the power is restored, a source memory block is selected among the memory blocks of the memory device 150 through the checkpoint information which is recorded in the header regions or the tail regions of the pages included in the memory blocks.

At step 840, a garbage collection operation is performed to the selected source memory block. The data stored in the source memory block are copied and stored in the pages included in a target memory block.

Then, at step 850, a recovery operation is performed to the memory system 110. For example, a recovery operation is performed such that data segments or meta segments, which are subsequent to data segments or meta segments copied to the target memory blocks but are not programmed into the source memory block due to the sudden power-off, are programmed into the target memory blocks.

Since detailed descriptions were made above with reference to FIGS. 5 to 7, for performing of a program operation corresponding to a command, for example, a write command, in particular, performing of a program operation to the memory blocks, recording of a checkpoint information indicating the starts or the ends of the program operation, preferential performing of a garbage collection operation, before a booting operation and a recovery operation, for the memory blocks in the case where a sudden power-off occurs while performing the program operation, and subsequent performing of the booting operation and the recovery operation, further descriptions thereof will be omitted herein.

FIGS. 9 to 17 are diagrams schematically illustrating application examples of the data processing system of FIG. 1.

Figure 9:
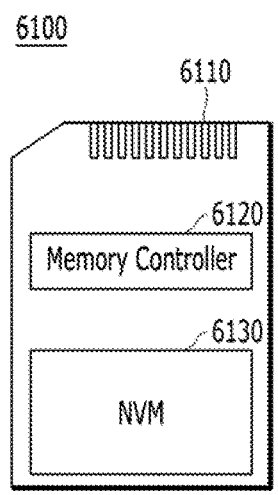
FIGS. 9 to 17 are diagrams schematically illustrating application examples of the data processing system of FIG. 1 in accordance with various embodiments of the present invention.

FIG. 9 is a diagram schematically illustrating another example of the data processing system including the memory system in accordance with the present embodiment. FIG. 9 schematically illustrates a memory card to which a memory system in accordance with an embodiment of the present invention is applied.

Referring to FIG. 9, the memory card 6100 may include a memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIGS. 1 and 5, and the memory device 6130 may correspond to the memory device 150 of the memory system 110 described with reference to FIGS. 1 and 5.

Thus, the memory controller 6120 may include a RAM, a processing unit, a host interface, a memory interface and an error correction unit. The memory controller 130 may further include the elements shown in FIG. 5.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with the present embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 5.

The memory controller 6120 and the memory device 6130 may be integrated into a single semiconductor device. For example, the memory controller 6120 and the memory device 6130 may construct a solid state driver (SSD) by being integrated into a single semiconductor device. The memory card 6100 may be a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD microSD and SDHC) and a universal flash storage (UFS).

Figure 10:
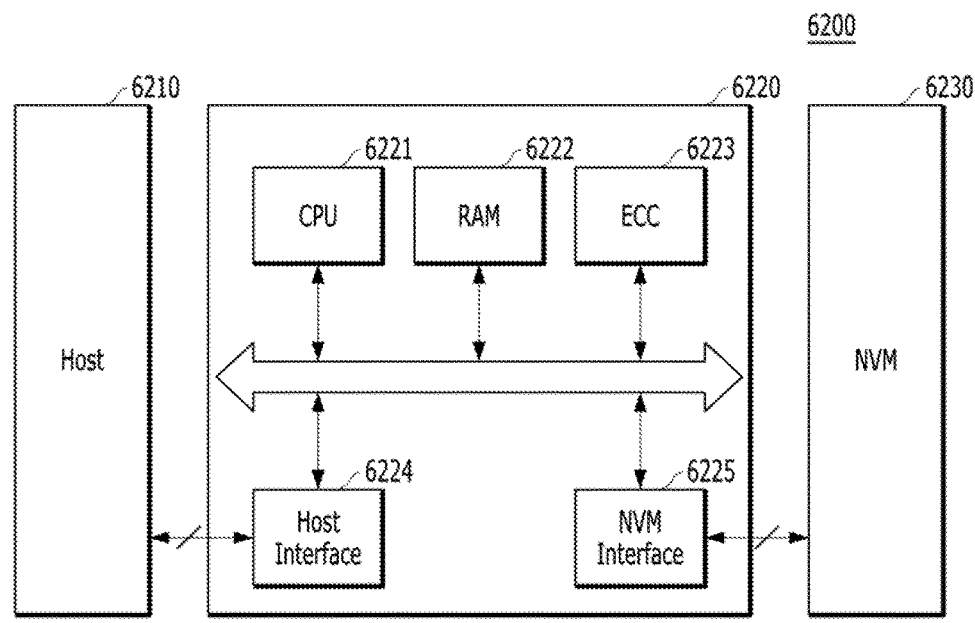

FIG. 10 is a diagram schematically illustrating another example of the data processing system including the memory system in accordance with the present embodiment.

Referring to FIG. 10, the data processing system 6200 may include a memory device 6230 having one or more nonvolatile memories and a memory controller 6220 for controlling the memory device 6230. The data processing system 6200 illustrated in FIG. 10 may serve as a storage medium such as a memory card (CF, SD, micro-SD or the like) or USB device, as described with reference to FIG. 1. The memory device 6230 may correspond to the memory device 150 in the memory system 110 illustrated in FIGS. 1 and 5, and the memory controller 6220 may correspond to the controller 130 in the memory system 110 illustrated in FIGS. 1 and 5.

The memory controller 6220 may control a read, write or erase operation on the memory device 6230 in response to a request of the host 6210, and the memory controller 6220 may include one or more CPUs 6221, a buffer memory such as RAM 6222 an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with the present embodiment may be applied to wired/wireless electronic devices or particularly a mobile electronic device.

Figure 11:
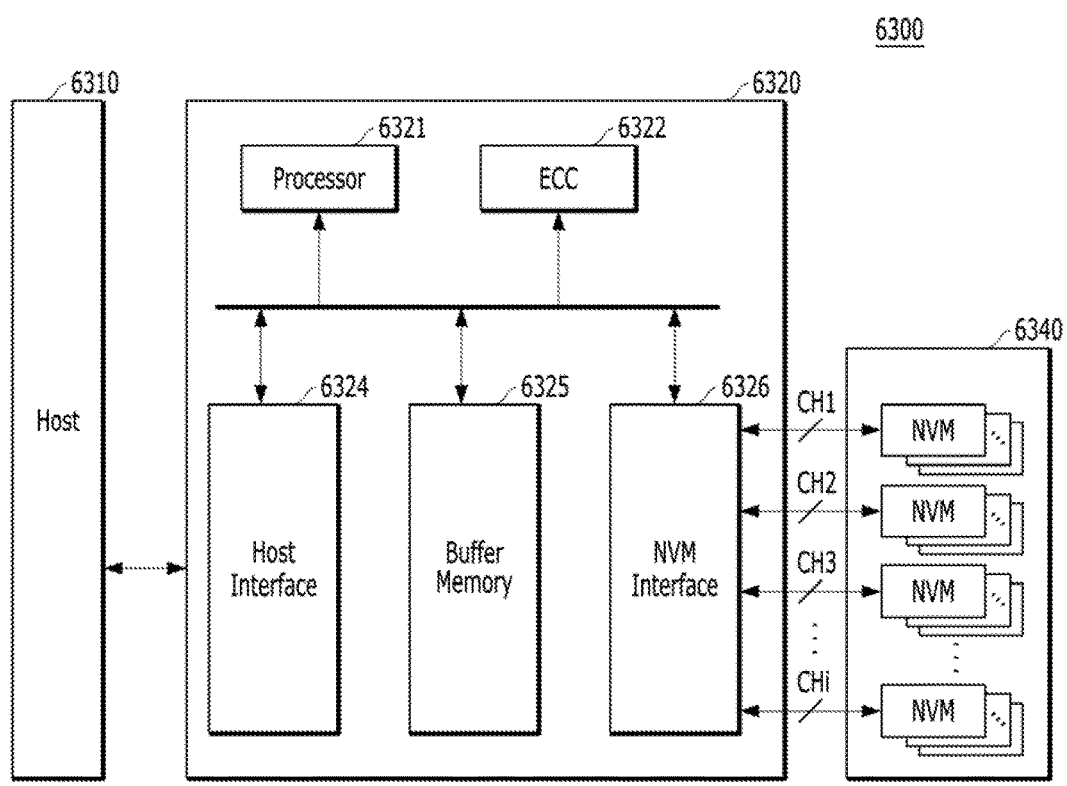

FIG. 11 is a diagram schematically illustrating another example of the data processing system including the memory system in accordance with the present embodiments FIG. 11 schematically illustrates an SSD to which the memory system in accordance with the present embodiment is applied.

Referring to FIG. 11 the SSD 6300 may include a controller 6320 and a memory device 6340 including a plurality of nonvolatile memories. The controller 6320 may correspond to the controller 130 in the memory system 110 of FIGS. 1 and 5, and the memory device 6340 may correspond to the memory device 150 in the memory system of FIGS. 1 and 5.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. For convenience of description, FIG. 10 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIGS. 1 and 5 is applied may be provided to embody a data processing system, for example, RAID (Redundant Array of Independent Disks) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 12:
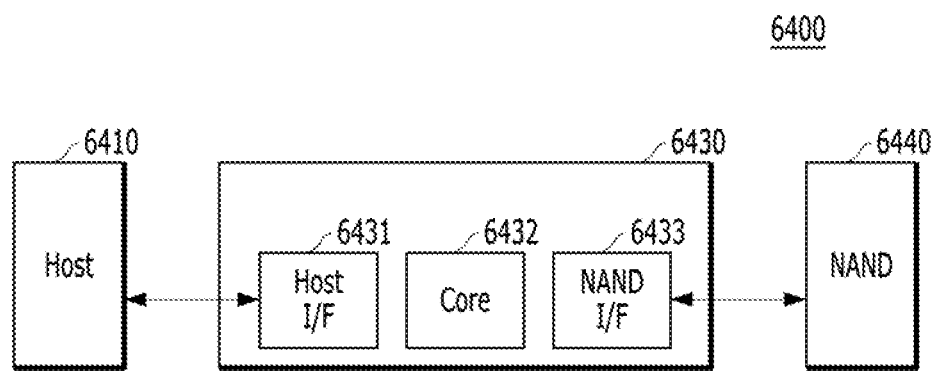

FIG. 12 is a diagram schematically illustrating another example of the data processing system including the memory system in accordance with the present embodiment. FIG. 12 schematically illustrates an embedded Multi-Media Card (eMMC) to which the memory system in accordance with the present embodiment is applied.

Referring to FIG. 12, the eMMC 6400 may include a controller 6430 and a memory device 6440 embodied by one or more NAND flash memories. The controller 6430 may correspond to the controller 130 in the memory system 110 of FIGS. 1 and 5, and the memory device 6440 may correspond to the memory device 150 in the memory system 110 of FIGS. 1 and 5.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410 and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 13 to 16 are diagrams schematically illustrating other examples of the data processing system including the memory system in accordance with the present embodiment. FIGS. 13 to 16 schematically illustrate UFS (Universal Flash Storage) systems to which the memory system in accordance with the present embodiment is applied.

Referring to FIGS. 13 to 16, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIGS. 1 and 5. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 10 to 12, and the UFS cards 6530, 6630, 6730 and 6830 may be embodied in the form of the memory card 6100 described with reference to FIG. 9.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate, with each other through various protocols other than the UFS protocol, for example, UFDs, MMC, SD, mini-SD, and micro-SD.

Figure 13:
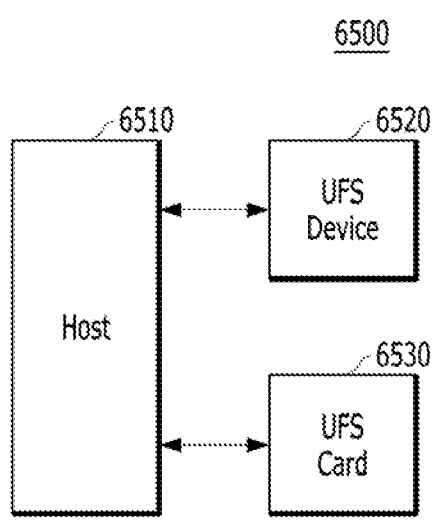

In the UFS system 6500 illustrated in FIG. 13 each of the host 6510, the UFS device 6520 and the UFS card 6530 may include UniPro. The host 6510 may perform a switching operation in order to communicate with the UFS device 6520 and the UFS card 6530. In particular the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In the present embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 14:
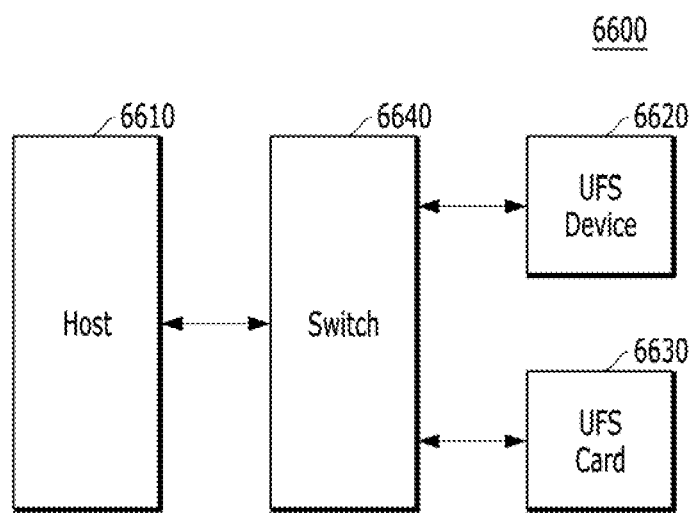

In the UFS system 6600 illustrated in FIG. 14, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the present embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 15:
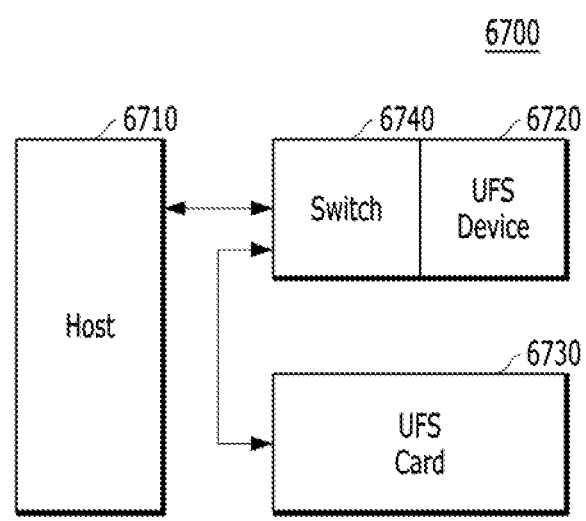

In the UFS system 6700 illustrated in FIG. 15, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the present embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 16:
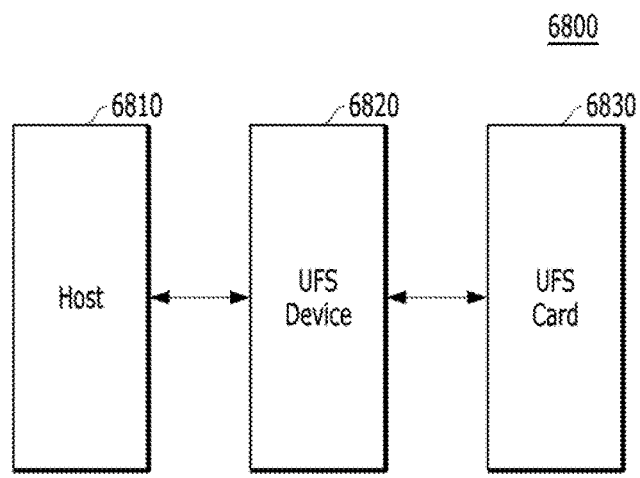

In the UFS system 6800 illustrated in FIG. 16, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. At this time, the host 6810 and the UFS card 6830 may communicate with each other through target ID switching between the M-PHY and UniPro modules of the UFS device 6820. In the present embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 17:
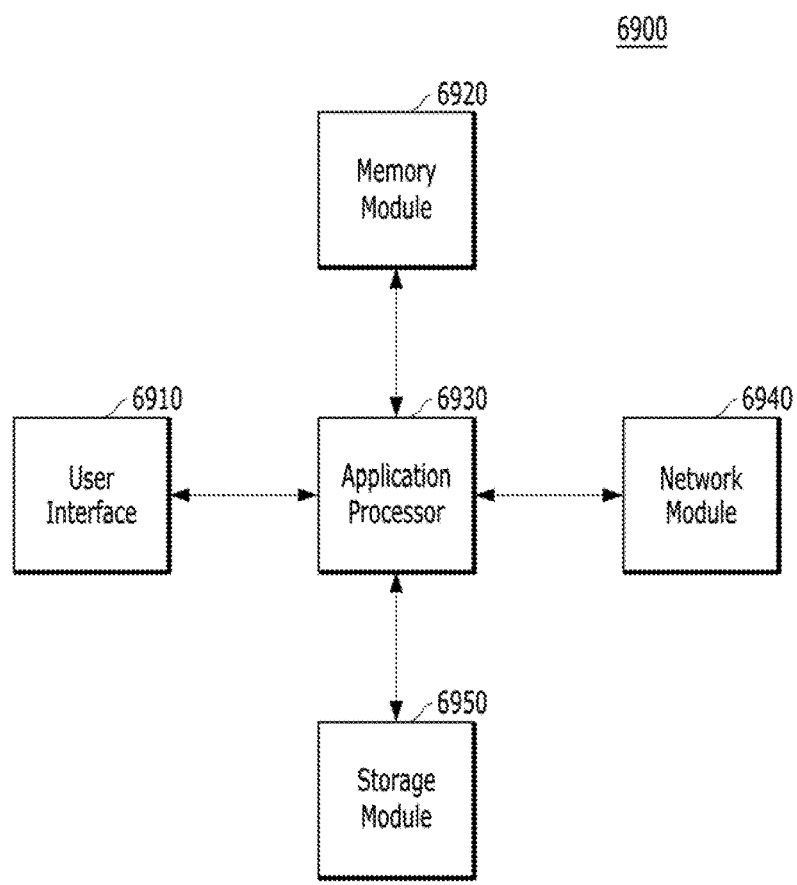

FIG. 17 is a diagram schematically illustrating another example of the data processing system including the memory system in accordance with an embodiment. FIG. 17 is a diagram schematically illustrating a user system to which the memory system in accordance with the present embodiment is applied.

Referring to FIG. 17, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as DRAM, SDRAM DDR SDRAM, DDR2 SDRAM, DDR3 SDRAM, LPDDR SDARM, LPDDR3 SDRAM or LPDDR3 SDRAM or a nonvolatile RAM such as PRAM ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIGS. 1 and 5. Furthermore, the storage module 6950 may be embodied as an SSD eMMC and UFS as described above with reference to FIGS. 11 to 16.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device an LED, a speaker and a motor.

Furthermore, when the memory system 110 of FIGS. 1 and 5 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

The memory system and the operating method thereof according to the embodiments may minimize complexity and performance deterioration of the memory system and maximize use efficiency of a memory device, thereby quickly and stably process data with respect to the memory device.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
   a memory device including a plurality of memory blocks each memory block having a plurality of pages; and
   a controller suitable for performing a program operation of storing data segments and meta segments in pages of at least one first memory block, and recording at least one checkpoint information for the program operation in at least one of the pages of the at least one first memory block,
   wherein in a case where a power-off occurs in the memory system while the program operation is performed and then a power is restored, the controller further checks the at least one checkpoint information, and
   wherein the controller further copies and stores at least some of the data segments and the meta segments stored in the at least one first memory block into at least one page of at least one second memory block according to a result of the checking of the at least one checkpoint information.

2. The memory system according to claim 1, wherein the at least one checkpoint information indicates starts and/or ends of the program operation.

3. The memory system according to claim 2, wherein the controller records first checkpoint information in at least first page of the pages of the at least one first memory block for a first program operation of first data segments and first meta segments into the at least first page of the at least one first memory block at a first time during the power-on state.

4. The memory system according to claim 3, wherein the controller further records second checkpoint information in at least second page of the pages of the at least one first memory block for a second program operation of second data segments and second meta segments in the at least second page of the at least one first memory block at a second time after the first time during the power-on state.

5. The memory system according to claim 4, wherein, in the case where the power-off occurs in the memory system while the second program operation is performed and then the power is restored at a third time after the second time, the controller further checks the first and second checkpoint information.

6. The memory system according to claim 5, wherein the controller checks the ends of the first program operation through the first checkpoint information, and then copies and stores the first data segments and the first meta segments into at least one page of the at least one second memory block.

7. The memory system according to claim 5, wherein the controller checks the starts of the first program operation and the second program operation through the first and second checkpoint information, and then copies and stores the first data segments, the first meta segments, the second data segments and the second meta segments into at least one page of the at least one second memory block.

8. The memory system according to claim 5, wherein the controller further performs a recovery operation for the second program operation, in the at least one second memory block.

9. The memory system according to claim 1, wherein the at least one checkpoint information is recorded in at least one of header regions and tail regions of at least one of the pages of the at least one first memory block.

10. A method for operating a memory system including a plurality of memory blocks each having a plurality of pages, the method comprising:
    performing a program operation of storing data segments and meta segments in pages of a at least one first memory block;
    recording at least one checkpoint information for the program operation in at least one of the pages of the at least one first memory block,
    checking the at least one checkpoint information in a case where a power-off occurs in the memory system while the program operation is performed and then a power is restored, and
    copying and storing at least some of the data segments and the meta segments stored in the at least one first memory block into at least one page of a at least one second memory block according to a result of the checking of the at least one checkpoint information.

11. The method according to claim 10, wherein the at least one checkpoint information indicates starts and/or ends of the program operation.

12. The method according to claim 11, wherein the performing of the program operation comprises recording first checkpoint information in at least first page of the pages of the at least one first memory block for a first program operation of first data segments and first meta segments into the at least first page of the at least one first memory block at a first time during the power-on state.

13. The method according to claim 12, wherein the performing of the program operation further comprises recording second checkpoint information in at least second page of the pages of the at least one first memory block for a second program operation of second data segments and second meta segments in the at least second page of the at least one first memory block at a second time after the first time during the power-on state.

14. The method according to claim 13, further comprising checking the first and second checkpoint information in the case where the power-off occurs in the memory system while the second program operation is performed and then the power is restored at a third time after the second time.

15. The method according to claim 14,
wherein the checking of the first and second checkpoint information comprises checking the ends of the first program operation through the first checkpoint information, and
wherein the copying and storing of the data includes copying and storing the first data segments and the first meta segments into at least one page of the at least one second memory block.

16. The method according to claim 14,
wherein the checking of the first and second checkpoint information comprises checking the starts of the first program operation and the second program operation through the first and second checkpoint information, and
wherein the copying and storing of the data includes copying and storing the first data segments, the first meta segments, the second data segments and the second meta segments into at least one page of the at least one second memory block.

17. The method according to claim 14, further comprising performing a recovery operation for the second program operation, in the at least one second memory block.

18. The method according to claim 10, wherein the at least one checkpoint information is recorded in at least one of header regions and tail regions of at least one of the pages of the at least one first memory block.

* * * * *